United States Patent [19]

Chartier

[11] 4,406,731
[45] Sep. 27, 1983

[54] APPARATUS FOR AND METHOD OF SEALING SHAFTS IN CRYSTAL-GROWING FURNACE SYSTEMS

[75] Inventor: Carl P. Chartier, Danvers, Mass.

[73] Assignee: Ferrofluidics Corporation, Nashua, N.H.

[21] Appl. No.: 271,980

[22] Filed: Jun. 9, 1981

[51] Int. Cl.³ .............................................. C30B 15/30
[52] U.S. Cl. ............................... 156/617 SP; 422/249
[58] Field of Search .............................. 422/246, 249; 156/617 SP, 608, 618; 277/3, 72 R, DIG. 5, 135, 59

[56] References Cited

U.S. PATENT DOCUMENTS

| | | | |
|---|---|---|---|
| 3,074,728 | 1/1963 | Freed | 277/3 |
| 3,471,156 | 10/1969 | Burns et al. | 277/3 |
| 3,514,114 | 5/1970 | Monahan | 277/3 |
| 3,643,964 | 2/1972 | Snelling et al. | 422/249 |
| 4,036,595 | 7/1977 | Lorenzini et al. | 422/249 |
| 4,097,329 | 6/1978 | Stock et al. | 156/617 SP |
| 4,174,843 | 11/1979 | Arena et al. | 277/3 |
| 4,189,157 | 2/1980 | Mahan et al. | 277/3 |
| 4,284,605 | 8/1981 | Pierrat | 422/249 |
| 4,300,772 | 11/1981 | Nissel | 277/3 |

FOREIGN PATENT DOCUMENTS 1389832  4/1975  United Kingdom .................. 277/59

OTHER PUBLICATIONS

Webster's New World Dictionary, World Pub. Co., N. Y., College Edition, 1968, p. 751.

*Primary Examiner*—Hiram H. Bernstein
*Attorney, Agent, or Firm*—Richard P. Crowley

[57] ABSTRACT

An apparatus for and a method of sealing a rotating shaft in a crystal-growing furnace, wherein the crystal-growing furnace includes a chamber adapted to be maintained at a contaminant-free inert atmosphere, with an inert gas at a low pressure, a rotatable shaft element which extends into the chamber, and a seal surrounding the shaft element, to separate the atmospheric pressure outside of the chamber from the low-pressure, contaminant-free atmosphere within the chamber, the seal having a plurality of sealing elements spaced apart along the shaft and defining an annular cavity between the sealing elements, the improvement which comprises means to and a method of maintaining an inert-gas atmosphere within the sealed cavity at a pressure slightly higher than the outside atmospheric pressure or the low pressure of the chamber, whereby, on failure of the sealing elements, inert gas passes from the cavity to the atmosphere or to the low-pressure chamber, thereby preventing the contamination of the chamber with atmospheric air.

18 Claims, 2 Drawing Figures

APPARATUS FOR AND METHOD OF SEALING SHAFTS IN CRYSTAL-GROWING FURNACE SYSTEMS

BACKGROUND OF THE INVENTION

Crystal-growing furnaces and systems provide for the growth of crystal ingots, such as silicon, by the Czochralski method, in which the crystal-growing furnace apparatus includes a crucible to contain a melt of the crystal and a mechanism for concurrently drawing a crystal from the melt along a vertical axis at a steady rate, while providing relative rotation about the vertical axis for the growing of crystal with respect to the melt. A pulling-head mechanism effects the vertical lift of the crystal ingot from the melt. In such crystal-growing furnaces, the growing of the crystal is carried out with the crucible within a chamber or a vacuum-tight housing, in order to provide growth of the crystal in a low-pressure, inert atmosphere which is free from contamination. Seals have been employed in the crystal-growing furnace systems, to provide seals about rotary shafts, such as a shaft employed to lift the crucible containing the melt, in order to maintain the meniscus of the crystal of the melt at a desired constant level, and to rotate the crucible with respect to the vertical axis of the furnace, as well as a seal to provide entrance into the growing chamber of the furnace, after growth of the crystal, and a seal into a growing chamber which provides a sealing relationship between the means to rotate the seeded crystal and to withdraw slowly the crystal from the melt.

Crystal-growing furnaces traditionally have had problems involved with the seals leaking. Typical seals employed with the rotating shaft in a crystal-growing furnace include lip seals, wherein a plurality of elastomeric, resilient lip seals are placed about the rotating shaft and axially spaced apart within a seal housing. However, leaking of one or more of the lip seals would permit the entrance of atmospheric air into the chamber of the crystal-growing furnace and contaminate the atmosphere.

Often, the crucible containing the melt is provided in a housing which is, in operation, pumped down to a low vacuum, such as $10^{-10}$ Torr or greater, and then an inert gas, such as argon or helium, is admitted to maintain a benign, inert atmosphere within the chamber and about the melt at below the atmospheric air pressure on the opposite side of the seal. Typically, the inert gas is admitted into the chamber at, for example, 60 to 80 standard cubic feet per hour and is adjusted by a throttle valve, to bring and maintain the low pressure of the chamber up to a desired vacuum pressure. It is desirable to maintain a contaminant-free, inert atmosphere at low pressure, in order to provide grown crystals of the desired purities, such as silicon having 1 to 5 or less parts per million of contaminants.

It has been found that, where the cavity between the sealing elements, such as lip seals, is packed with grease or other viscous lubricants, the failure of lip seals, particularly on the low-pressure side, leads to contamination of the low-pressure chamber and the melt with atmospheric air and grease material. Introduction of air or other contaminants into the chamber is most undesirable, since the oxygen and nitrogen in the air tend to react with the melt, as well as water vapor, providing for discolored crystals of unacceptable purity. Thus, it is desirable to provide for a crystal-growing furnace apparatus and method, whereby more effective sealing can be accomplished of the low-pressure vacuum chamber in which the crystal-growing operation is carried out.

SUMMARY OF THE INVENTION

The invention relates to an apparatus for and a method of maintaining a contaminant-free, low-pressure atmosphere in a crystal-growing furnace, and in particular to an apparatus and method for sealing rotating shafts employed in crystal-growing furnace systems.

It has been discovered that a contaminant-free environment may be maintained within a chamber of a crystal-growing furnace, by providing a shaft seal which has a cavity, and wherein an over-pressure of an inert, benign fluid is maintained in the cavity, so that any leakage occurring in a portion of the seal on the chamber side tends to be that of an inert fluid acceptable within the environment of the chamber, and which is benign to the crystal-growing process. Any leakage on the outer portion of the seal tends to be the inert fluid, which prevents the introduction of atmospheric air into the cavity.

It has been found that employing, for example, a slight over-pressure of from 0.1 to 1 psi or greater above atmospheric pressure of an inert gas, such as helium or argon, that a contaminant-free atmosphere is maintained, even during minor leaks of the seal element, so that clear, grown crystal ingots, with little or no visible oxidation of the crystal surface and of acceptable purity, are prepared. The formation of grown crystals, having a dark-colored and visible oxidation of the surface, occurs with the same seals when leaks occur, without the employment of the over-pressure of the inert gas within the cavity between the sealing elements. Thus, the employment of an inert gas neutralizes the effects of any air or other contaminant gas leakage from outside the chamber which may occur in a particular seal employed, and prevents the passage of air from the atmosphere through the cavity and into the low-pressure chamber of the crystal-growing furnace.

In operation, a multiple-stage seal; that is, a seal having a plurality of sealing elements, such as a lip seal or O-rings, is formed in a housing about a shaft element, typically a rotating shaft element, or which may include other movable shaft elements, which passes from the atmosphere into a low-pressure environment within the crystal-growing furnace. The sealing elements are typically spaced apart, to form one or more cavities between the sealing elements, with the simplest form being a multiple-stage seal having an inner seal on the vacuum side of a rotating shaft, and spaced apart to form an annular cavity from an outer lip seal on the atmospheric side of the seal, and whereby a pressurized inert gas is introduced into the cavity through the housing and is maintained at a slight over-pressure during operation of the crystal-growing furnace.

In practice, the seal may contain an inlet port, for the introduction of the inert gas, and also an outlet port, in order to permit the bleeding off or purging of air within the cavity through the passage of inert gas, to provide for a pumping down of the cavity and the introduction, or the sweeping out, of the air through the use of an inert-gas sweep from the inlet port.

In another embodiment, the seal may have more than one port, with the other port interconnected to the part of another seal in a serial arrangement. The inert gas may be maintained in a static mode within the cavity, or a constant flow of the inert gas may be maintained through the cavity in each housing in one or a plurality of connected seals. Usually, only a sufficient amount of over-pressure is employed in the cavity, to ensure that any leakage in the inner or outer seal in one or more serial or parallel cavities does not lead to contamination by the air into the inner, low-pressure, contaminant-free chamber of the crystal-growing furnace. The invention permits the employment of the multiple-stage lip seals, as employed in the prior art; thus, permitting the easy conversion of the multiple-stage lip seals presently in use to the inventive apparatus and method.

The invention will be described in particular in connection with an illustrative embodiment; however, it is recognized that persons skilled in the art may make various changes and modifications in the illustrative embodiment as described, all falling within the spirit and scope of the invention. For example, the apparatus and method may be employed in any apparatus and method, wherein it is desired to protect one pressure environment from another higher-pressure environment intermediate the two environments.

DESCRIPTION OF THE EMBODIMENTS

Figure 1:
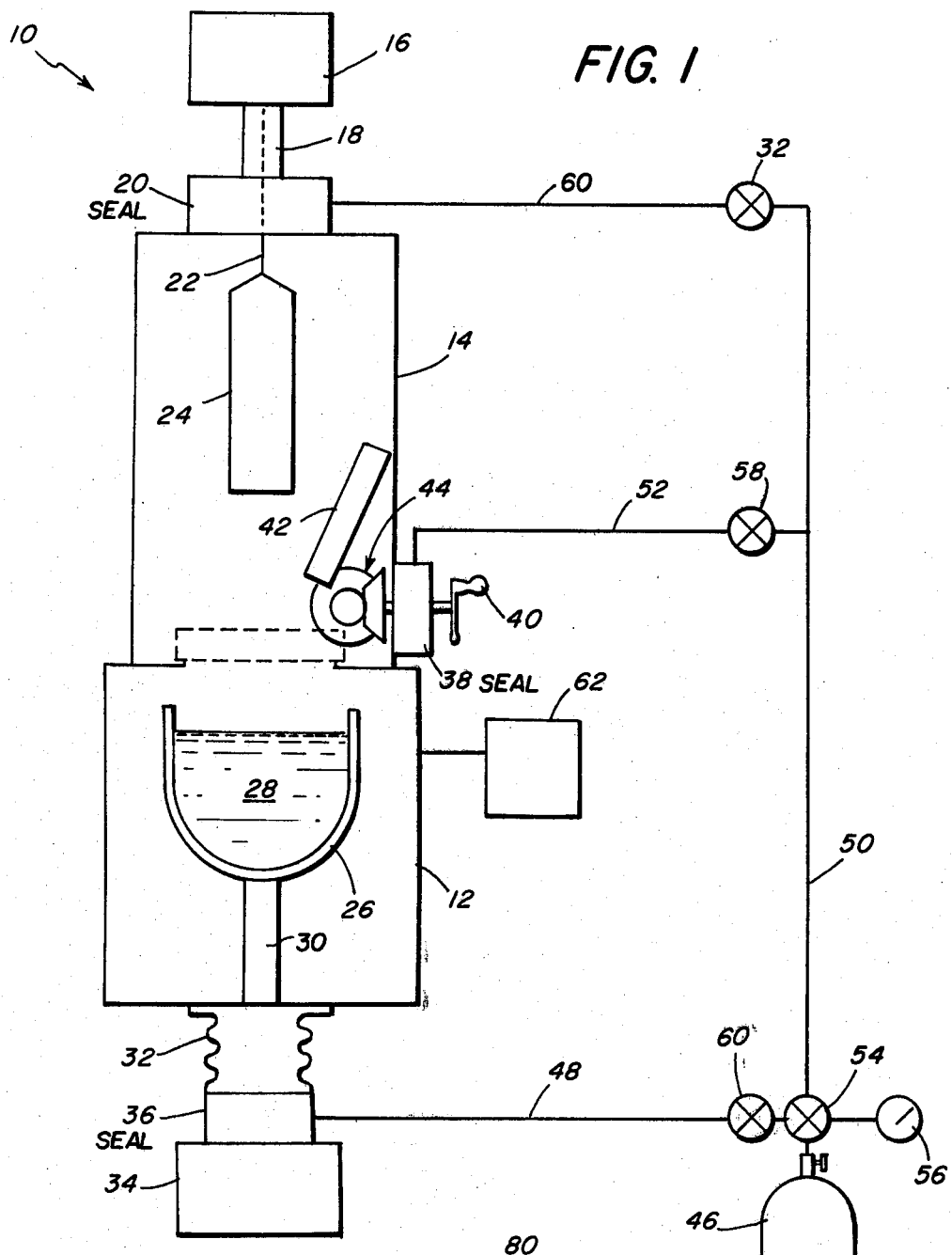
FIG. 1 is a schematic illustration of a crystal-growing furnace apparatus employing the invention.

FIG. 1 shows a crystal-growing furnace system 10 which includes a furnace tank or contaminant-free, vacuum-pressure chamber 12 containing argon, and an upper, crystal-growing chamber 14 for the growth of a crystal, and a pulling-head mechanism 16 having a rotating shaft 18 which extends through multiple-stage lip seal 20. A chain element 22 retains the seeded crystal withdrawn from the melt, and, as illustrated, a single, silicon crystal ingot 24 is shown after growth positioned within the growing chamber 14. The melt 28 is contained within a crucible 26 supported on a rotating shaft 30. The shaft 30 extends through the lower wall of chamber 12, bellows 32 and multiple-stage seal 36 to a crucible-drive lift mechanism, wherein the crucible is driven in a vertical path to the desired position, to maintain the surface of the melt at a constant location, while the crucible 26 is rotated on rotating shaft 30, to provide relative rotation between the seeded crystal and the melt. The growing chamber 14 contains a sealed door (not shown), whereby the grown crystal 24 may be removed from the growing chamber. The growing chamber includes a valve plate 42, shown in the open position and in dottled lines in the closed position, adapted to be swung by worm-drive mechanism 44 to a closed position, after the growth of the crystal, through the employment of a hand crank 40 having a shaft which passes through a multiple-stage seal 38 in the wall of the growing chamber 14. In this arrangement, after growth of the crystal 24, the valve plate 42 may be closed, the growing chamber reduced to atmospheric pressure, and the growing-chamber door opened and the crystal 24 removed.

The crystal-growing furnace system includes an inert-gas cylinder or source 46, such as argon or helium, at a pressure greater than the atmosphere and in communication through conduits 48, 50, 52 and 60 with the seals 36, 38 and 20. Pressure-control valves 32, 58 and 60 are shown to control gas flow and pressure to each seal, together with a pressure gauge and pressure regulator 56 and a gas-control valve 54. A vacuum pump 62 is employed to reduce the pressure within the furnace tank 12, to maintain the desired pressure, as required. In the embodiment described, seals 20, 38 and 36 all have rotatable shaft elements passing through the seals, and, in a typical crystal-growing system, such seals are employed to maintain the interior of the growing chamber 14 and the furnace tank 12 in operation at a low, argon-containing, contaminant-free atmosphere, and to exclude air from the atmosphere from entering the chamber. In the embodiment shown, the pulling head is spaced apart; however, in some embodiments, the pulling head also may be maintained within the low-pressure, contaminant-free environment.

Figure 2:
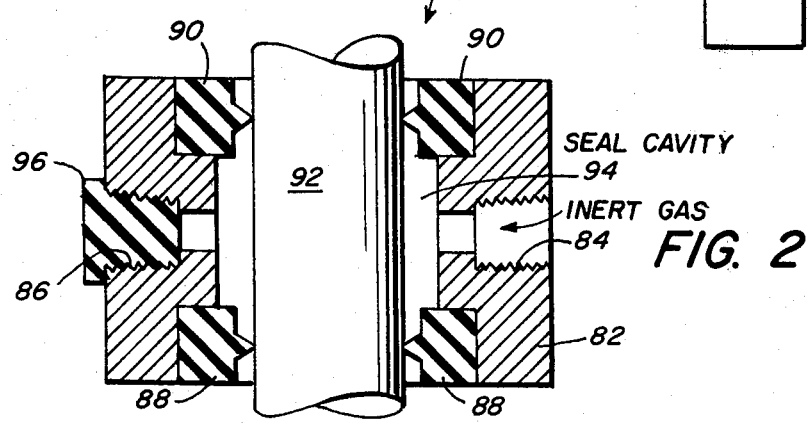
FIG. 2 is an enlarged, fragmentary, sectional view of a seal employed in the apparatus of FIG. 1.

FIG. 2 is a sectional view of a multiple-stage lip seal 80, which may be used as seal 20, 36 or 38, shown as having a housing 82, with inlet and outlet ports 84 and 86, with port 86 having a threaded plug 96. The seal includes a peripheral, inner lip seal 90 against the vacuum or low-pressure side and a peripheral, outer lip seal 88 against the atmospheric side, the seals composed of an elastomeric material and defining a generally annular cavity 94 between the seals 88 and 90 and about a rotating shaft element 92.

In operation, an inert gas from the gas source 46 is introduced through lines 48, 50 and 52 to at least one side of the seal, such as seal 80, and introduced into port 84, while port 86 is open to purge air from the cavity 94. After purging of the air, port 86 is sealed through plug 96, and an inert-gas pressure is maintained within cavity 94 through the gas introduced into port 84 at a pressure above the atmospheric pressure.

In the event of a leakage due to failure of the inner lip seal 90, then only the benign, inert, high-pressure gas from cavity 94 leaks into the low-pressure, contaminant-free environment within the furnace tank 12, and there is no contamination introduced into the crystal-growing process. If outer seal 88 leaks or fails, then the pressurized gas in cavity 94 passes outwardly and excludes the presence of air from passing into the cavity. Where failure of both the inner and outer seals 88 and 90 occurs, then maintaining the slight over-pressure of the gas within the cavity 94 protects the low-pressure, contaminant-free environment within the furnace tank 12.

In the system described and illustrated, pressurized inert gas is introduced into each seal on one side; however, it is recognized that, rather than using a static mode, a dynamic system may be maintained, and that flow communication may remain, in regards to both the introduction of the inert gas into port 84 and out of port 86 to another seal, in order to maintain a uniform over-pressure of the gas within all seal cavities, and with all of the seals employed in a crystal-growing furnace, such as seals 20, 38 and 36, maintained under pressure. Also, the system described shows a common source of pressurized gas for all seals; however, it is recognized that separate pressurized gas sources may be used for each seal. Further, the crystal-growing furnace has been shown with various seals through which rotating shaft elements are passed; however, the crystal-growing furnace may include one or more of such seals or other seals, all or just some of which may employ the method and apparatus of the invention.

What I claim is:

1. In a crystal-growing furnace apparatus which comprises:

(a) a chamber means for maintaining a contaminant-free atmosphere at a first pressure for the growing of a crystal from a melt in the chamber;

(b) a movable shaft element extending from outside the chamber means in a contaminant atmosphere at a second pressure and into the chamber means; and (c) a sealing means for sealing the periphery of the shaft element, to prevent contamination of the chamber means, the sealing having spaced-apart inner and outer peripheral sealing elements about the shaft to define a peripheral cavity about the shaft element, the improvement which comprises:

(i) a source of inert, pressurized gas, which gas is acceptable in the environment of the chamber or benign to the growing of the crystal in the chamber, and (ii) means for introducing and maintaining pressurized inert gas from the source in the cavity of the sealing means at a pressure higher than the first pressure of the chamber means and the second pressure of the atmosphere, thereby, on leaking of the sealing means, preventing contamination of the chamber means.

2. The apparatus of claim 1 which includes a plurality of sealing means and shaft elements and a single source of inert pressurized gas, and conduit means to supply inert gas from the source to each sealing means.

3. In a crystal-growing furnace apparatus which comprises:

(a) a chamber means for maintaining a contaminant-free, low pressure for the growing of a crystal;

(b) crucible means within the chamber means containing a melt from which the crystal is to be drawn;

(c) pulling-head means for drawing a crystal from the melt in the crucible means;

(d) seed-holder means for securing a seeded crystal drawn from the melt;

(e) sealing means for sealing the chamber means from contamination by outside atmospheric air;

(f) a movable shaft-element means passing from the high pressure of atmospheric air to the low pressure of the chamber means; and (g) the sealing means comprising (i) a seal housing, (ii) a plurality of peripheral sealing elements in the housing and about the shaft means and axially spaced apart to define at least one cavity therebetween, and (iii) an inlet-port means to the cavity, the improvement which comprises:

(a) a source of pressurized inert fluid, the fluid benign to the growing of a crystal in the contaminant-free low pressure of the chamber means and having a pressure greater than the atmospheric pressure; and (b) means to introduce the pressurized inert fluid into the cavity about the shaft element and to maintain the pressure of the inert fluid in the cavity above the atmospheric pressure of the atmospheric air, whereby contaminated atmospheric air is prevented from entering the chamber on leakage of the sealing elements of the sealing means, due to the inward or outward flow of the high-pressure inert fluid from the cavity.

4. The apparatus of claim 3 wherein the sealing means includes an outlet-port means for purging air from the cavity by introducing the inert fluid into the inlet-port means.

5. The apparatus of claim 3 which includes a plurality of sealing means and shaft-element means sealed by the sealing means, and a single source of inert fluid and conduit means to the inlet-port means of each sealing means.

6. The apparatus of claim 3 which includes pressure-regulator means for maintaining a slight over-pressure over the atmospheric pressure of the inert fluid in the cavity.

7. The apparatus of claim 3 which includes means for rotating the shaft-element means, with the rotatable shaft element extending through and sealed by the sealing means.

8. In a method for growing a crystal from a melt, which method comprises:

(a) maintaining a contaminant-free atmosphere at a first pressure for the growing of a crystal from a melt;

(b) positioning a movable shaft element between the contaminant atmosphere at a second pressure and the contaminant-free atmosphere; and (c) sealing the shaft element with a seal about the shaft element, the seal composed of inner and outer sealing elements to form inner and outer sealing barriers about the shaft element and a peripheral cavity therebetween and between the contaminant-free atmosphere and the contaminant atmosphere, the improvement which comprises providing an inert fluid in the cavity about the sealed shaft element, the inert fluid having a pressure in the cavity greater than the first or second pressure, the inert fluid benign to the growing of the crystal in the contaminant-free atmosphere or acceptable in the contaminant-free atmosphere, whereby, on leaking of the shaft seal element, the contaminated atmosphere is prevented from entering the contaminant-free atmosphere.

9. The method of claim 8 wherein the contaminant-free atmosphere at the first pressure comprises a pressure lower than atmospheric pressure, and the pressurized fluid is an inert gas and the contaminant-free atmosphere contains an inert gas.

10. The method of claim 9 wherein the pressurized gas is the same inert gas as in the contaminant-free atmosphere.

11. The method of claim 8 wherein the pressurized fluid is an inert pressurized gas.

12. The method of claim 8 wherein the pressurized gas is helium or argon.

13. The method of claim 8 which includes maintaining the pressure of the inert fluid in the cavity slightly over the pressure of the contaminant atmosphere, and the pressure of the contaminant atmosphere is greater than the pressure of the contaminant-free atmosphere.

14. The method of claim 8 which includes purging the cavity of atmospheric air.

15. The method of claim 8 wherein the contaminated atmosphere comprises air at an atmospheric pressure, which pressure is greater than the first pressure of the contaminant-free atmosphere.

16. The method of claim 8 which includes providing the pressurized inert fluid to a plurality of sealing cavities from a single fluid source.

17. The method of claim 8 which comprises disposing peripheral elastomeric spaced-apart inner and outer lip seal elements about the shaft to form the cavity.

18. The method of claim 8 which comprises introducing a pressurized inert gas in the cavity and continuously withdrawing pressurized inert gas from the cavity to maintain the pressurized gas in the cavity at a defined high pressure.

* * * * *